United States Patent
Kruip et al.

(10) Patent No.: US 8,162,037 B2
(45) Date of Patent: Apr. 24, 2012

(54) DEVICE FOR GENERATING A PULSED MAGNETIC FIELD

(75) Inventors: Marcel Jan Marie Kruip, Oxford (GB); Marijn Pieter Oomen, Erlangen (DE); Peter Van Hasselt, Erlangen (DE)

(73) Assignees: Siemens PLC, Surrey (GB); Siemens AG, Munich (DE)

( * ) Notice: Subject to any disclaimer, the term of this patent is extended or adjusted under 35 U.S.C. 154(b) by 1377 days.

(21) Appl. No.: 11/455,720

(22) Filed: Jun. 20, 2006

(65) Prior Publication Data

US 2007/0001521 A1    Jan. 4, 2007

(30) Foreign Application Priority Data

Jun. 20, 2005   (DE) ............ 10 2005 028 414

(51) Int. Cl.
  *F28D 15/00*   (2006.01)
(52) U.S. Cl. ............... 165/104.28; 165/104.21; 62/51.1; 310/52; 310/261
(58) Field of Classification Search ............ 62/51.1; 165/104.21, 104.28; 310/52, 261
  See application file for complete search history.

(56) References Cited

U.S. PATENT DOCUMENTS

| 4,726,199 | A | * | 2/1988 | Takano et al. ............ 165/104.21 |
| 5,485,730 | A | * | 1/1996 | Herd ................. 62/51.1 |
| 5,609,034 | A | * | 3/1997 | Mita et al. ............. 62/6 |
| 6,186,755 | B1 | * | 2/2001 | Haga .............. 165/104.28 |
| 6,246,308 | B1 | * | 6/2001 | Laskaris et al. ............. 62/51.1 |
| 6,376,943 | B1 | * | 4/2002 | Gamble et al. .............. 310/52 |
| 6,783,059 | B2 | * | 8/2004 | Laskaris et al. ............. 324/318 |
| 6,812,601 | B2 | * | 11/2004 | Gamble et al. ............. 310/52 |
| 7,207,178 | B2 | * | 4/2007 | Steinmeyer ............. 310/52 |
| 7,260,941 | B2 | * | 8/2007 | van Hasselt ............. 165/104.21 |
| 7,272,938 | B2 | * | 9/2007 | Frank et al. ............ 165/104.21 |
| 7,449,889 | B1 | * | 11/2008 | Huang et al. ............. 324/318 |
| 7,477,055 | B1 | * | 1/2009 | Huang et al. ............. 324/318 |
| 2004/0056541 | A1 | * | 3/2004 | Steinmeyer ............. 310/52 |
| 2005/0160744 | A1 | * | 7/2005 | Frank et al. ............. 165/104.21 |
| 2005/0252219 | A1 | | 11/2005 | Van Hasselt |
| 2006/0158059 | A1 | * | 7/2006 | Steinmeyer et al. .......... 310/261 |

FOREIGN PATENT DOCUMENTS

| DE | 1 279 864 | | 10/1968 |
| DE | 102 21 639 | | 11/2003 |
| DE | 102 21 639 | A1 | 11/2003 |
| JP | 61-71608 | | 4/1986 |
| JP | 6-342721 | | 12/1994 |
| JP | 7-161888 | | 6/1995 |
| WO | WO 03/098645 | A1 | 11/2003 |

OTHER PUBLICATIONS

Japanese Office Action issued on Jan. 15, 2009 in corresponding Japanese Patent Application 2006-166932.
Office Action for German Patent Application No. 10 2005 028 414.0-24; dated May 23, 2006.

* cited by examiner

*Primary Examiner* — Ljiljana Ciric
(74) *Attorney, Agent, or Firm* — Staas & Halsey LLP

(57) ABSTRACT

A pulsed magnetic field is generated by a device having a magnet to be operated in pulse operation which contains at least one superconductive refrigerant-free winding that is disk-shaped or saddle-shaped. Also included is a refrigerating unit which has at least one cold head. A line system, having a refrigerant circulating in it according to a thermosiphon effect, thermally couples the winding to the cold head. The line system has a plurality of separate pipes lying next to one another. The pipes, open onto a common refrigerant distributor and closed at the other end, are thermally coupled to the surface of the disk-shaped or saddle-shaped winding.

28 Claims, 2 Drawing Sheets

US 8,162,037 B2

DEVICE FOR GENERATING A PULSED MAGNETIC FIELD

CROSS REFERENCE TO RELATED APPLICATIONS

This application is based on and hereby claims priority to German Application No. 10 2005 028 414.0 filed on Jun. 20, 2005, the contents of which are hereby incorporated by reference.

BACKGROUND OF THE INVENTION

1. Field of the Invention

The invention relates to a device for generating a pulsed magnetic field, with a magnet to be operated in pulse operation which contains at least one superconductive refrigerant-free winding.

2. Description of the Related Art

Besides the metal superconductor materials known for a long time, for example NbTi or $Nb_3Sn$, which have very low transition temperatures $T_c$ and are therefore referred to as low-$T_c$ superconductor materials or LTS materials, metal oxide superconductor materials with transition temperatures $T_c$ above 77 K are also known. The latter materials are also referred to as high-$T_c$ superconductor materials or HTS materials.

Attempts are also being made to construct superconducting magnet windings with conductors using such HTS materials. Owing to their still comparatively low current-carrying capacity in magnetic fields, particularly with a field strength in the tesla range, many of the conductors of such windings are still kept at a temperature level below 77 K, for example between 10 and 50 K, in spite of the intrinsically high transition temperatures $T_c$ of the materials being used, so as to be able to carry significant currents at higher field strengths of for example a few tesla.

Special refrigerating units, for example in the form of so-called cryocoolers with a pressurized helium gas closed circuit, are preferably employed to cool the winding in the aforementioned temperature range. Such cryocoolers have the advantage that the refrigerating power is available without handling cryogenic liquids. The superconducting coil winding is only coupled by thermal conduction to the cold head of such a cryocooler, i.e. it is refrigerant-free per se.

In magnet systems of magnetic resonance machines, helium bath coolers are preferably employed. This, however, requires a significant liquid helium stock of the order of hundreds of liters. If the magnet becomes quenched, i.e. the magnet changes from the superconducting state to the normal conducting state because of a jump in temperature, then an undesired pressure build-up takes place in the cryostat as the helium evaporates.

Refrigerator cooling with the use of compounds having good thermal conductivity, for example in the form of correspondingly designed Cu tubes between the cold head of a refrigerating unit and the superconducting winding of the magnet, have furthermore been employed for LTS magnets. A disadvantage, however, is that depending on the distance between the cold head and the object to be cooled, the large cross sections necessary for thermal coupling lead to a significant increase in the cold mass. Particularly for applications in magnetic resonance machines, this constitutes a problem since spatially extended magnet systems necessarily require longer cooling times.

WO 03/098645 furthermore discloses a device of the type mentioned in the introduction in which a line system is provided, having at least one pipe in which a refrigerant flows while circulating according to the thermosiphon effect. The line system is coupled to the cold head of the refrigerating unit. The liquid refrigerant is supplied to the line system or pipe at the cold head. It flows downward in the line owing to the latter's gradient existing over the entire length of the pipe system. During this, it absorbs heat from the winding and evaporates. The evaporated refrigerant flows back up in the pipe, oppositely to the flow direction of the liquid refrigerant, and recondenses on a cold surface of the refrigerating unit or cold head. Circulation is thus set up inside the pipe.

The line system known from WO 03/098645 is used to cool the two open superconducting magnet windings of a magnetic resonance machine, which is designed as a so-called C magnet. The two separate coils lie vertically above each other, and are wound as an open cylindrical ring with a relatively large central opening. The two pipes provided in both described examples are respectively fed in the manner of a winding along the inner surface of the wound cylindrical coils, the pipe system being first supplied to one winding and then extending to the second winding. The cold head lies above the upper winding so that the evaporating refrigerant flows back up in the pipe system to the cold head, where it recondenses.

These coils are used to generate a constant basic magnetic field applied during the imaging in the scope of a magnetic resonance scan. They are thus operated statically. In certain applications, however, it is also necessary to operate superconducting magnetic field coils in a pulsed fashion, i.e. to generate and switch off the magnetic field in cyclic operation. One example of use for the field of magnetic resonance technology, when employing a low-field magnetic resonance machine which only generates fairly low basic magnetic fields in the range <0.3 T via its integrated superconducting magnet system, is the facility of also recording images based on high-field excitation. To this end, particularly for the described C magnet machines, it is necessary to be able to put one or two further magnets with superconducting windings, which can generate an additional magnetic field in the range >0.3 T, as required between the machine's own two magnets between which the patient is placed for the scan. In this case, it is then necessary to operate these coils in a pulsed fashion, i.e. the high magnetic field is generated and switched off again at very short time intervals. These are therefore AC or pulse coils. During the time when the high magnetic field is switched off, the image acquisition is carried out by using the machine's conventional imaging system.

A problem—independent of the aforementioned field of use—when using such AC or pulse coils, however, is that in any event the pulse operation causes large eddy currents in all the metal components of the cooling system, which may be made of copper. These cause ohmic losses which stress the cooling system. The eddy currents, which generate their own magnetic field, also cause deviations from the desired magnetic field profile of the coil, which impairs the imaging quality in magnetic resonance equipment.

SUMMARY OF THE INVENTION

It is therefore an aspect of the invention to provide a device for generating a pulsed magnetic field, in which the problems resulting from the eddy currents generated by the pulse operation are minimized.

According to an aspect of the invention, a device is provided for generating a pulsed magnetic field, with a magnet to be operated in pulse operation which contains at least one superconductive refrigerant-free winding that is disk-shaped or saddle-shaped. A refrigerating unit which has at least one cold head is thermally coupled to the winding by a line system that forms coupling means with a refrigerant circulating in it according to a thermosiphon effect. The line system includes a plurality of separate pipes lying next to one another, which open onto a common refrigerant distributor and are closed at the other end, and which are thermally coupled to the surface of the disk-shaped or saddle-shaped winding.

In the device according to an aspect of the invention, which can be operated in a pulsed fashion using alternating current or dedicated pulses, a thermosiphon line system is employed having a plurality of separate pipes, which are supplied with refrigerant via a common refrigerant distributor but are closed at the other end. A closed circuit is thus not formed, and therefore neither is an electrically closed circuit through which eddy currents could flow or in which the eddy currents could be induced during magnetic field changes. The line system is thus—in electrical terms—open since a closed circuit is not provided, i.e. there are no turns of the pipe system. This line system is, or the pipes are, thermally coupled on the respective winding surface to the winding which may be designed to be disk-shaped or saddle-shaped for pulse coils. The pipe assembly is thus thermally coupled to the large-area disk side in the case of a disk-shaped winding, and for example to the large-area outer saddle surface in the case of a saddle-shaped winding. Thermal coupling which permits very good cooling of the winding is therefore achieved, since the pipes are coupled to the respective winding over a very large area.

Owing to the configuration of the line system according to an aspect of the invention, it is thus possible on the one hand to minimize the eddy current problems since these can be induced only to a negligible extent in the line system, if at all, and cannot flow there owing to the "open" design of the tube system, and on the other hand a very good cooling effect is achieved owing to the large-area lateral coupling while at the same time the advantageous thermosiphon effect can be used for the pulsed magnet.

In the case of a disk-shaped winding, the pipes are designed to be arc-shaped and are connected to one or both sides of the common refrigerant distributor while lying in a plane. They preferably travel on concentric circular paths, which allows dense packing, i.e. very many pipes can be laid in relation to the contact surface available on the winding side in order to effectively remove heat from all parts of the disk coils, without incurring excessive local temperature rises. In the end, however, the precise number of pipes required per unit area will be selected as a function of the power loss density and the thermal conductivity in the turn. Moreover, the ability to use many pipes for cooling also makes it possible to obviate copper plates which are used for heat transport in known systems, and which represent a source of eddy currents. Preferably, the pipes traveling over a common circular path of equal radius, which extend on either side of the refrigerant distributor, are equally long, i.e. the refrigerant throughput is the same in both "line branches" extending laterally to the refrigerant distributor, which correspond to each other, so that locally different cooling effects do not occur.

It is particularly expedient for the pipes to travel in two separated parallel planes and for the winding to be provided between the pipes, and thereby thermally coupled on both sides. This produces a kind of sandwich structure, in which the arc-shaped pipes, which are for example attached together to a common refrigerant distributor, travel in two separate planes. These are separated by a few centimeters from each other, so that the winding can be placed between the pipes. The disk winding is thereby optimally cooled on both disk sides.

As an alternative or in addition to this, it is also possible for one or more further pipes, which travel in a further plane along the outside of the disk-shaped winding and/or the inside of the disk-shaped winding designed as a ring, to be connected to the common refrigerant distributor. In this configuration, the cooling thus takes place not only over the large-area disk side but, depending on the configuration, also on the outside i.e. the outer narrow disk side or, in a ring configuration, also on the narrow inside or the inner circumference.

As an alternative to the disk coil, the winding may also be designed to be saddle-shaped. In this configuration as well, the pipes are designed to be arc-shaped and are connected in a comb-like fashion to one or both sides of the common refrigerant distributor. Owing to the comb-like structure, an electrically closed circuit is not produced here either. If the pipes extend on both sides of the common refrigerant distributor, then they are preferably all equally long so that approximately the same refrigerant throughput can be achieved everywhere.

To further minimize any incidence of eddy currents, the pipes and optionally the common refrigerant distributor are made of stainless steel. Stainless steel has an electrical resistance about 1000 times as great as copper at the operating temperatures, the effect of which is that any eddy currents still induced will decay substantially faster than in a copper tube, which is very important and advantageous particularly at a high pulse frequency. In this way, the eddy currents set up in the circumferential direction in copper tubes because of the extremely high conductivity, which in turn themselves generate magnetic fields that cause perturbation, can also be avoided in any case.

Another advantage of using stainless steel is moreover that the material is mechanically more stable than copper, which, for the given maximum positive pressure in the cooling system, makes it possible to use pipes with a smaller wall thickness compared to copper tubes.

The pipes and optionally the common refrigerant distributor are preferably embedded or encapsulated in a support made of an electrically insulating material, preferably plastic, in particular glass fiber-reinforced plastic. The pipes are fixed in their position by this support. The pipes themselves may be designed to be cross-sectionally round or rectangular, for example square.

In the case of using cross-sectionally round pipes, it is particularly advantageous for the side of the pipes which faces the winding to be flattened. The pipes are thus mechanically processed on one side, for example milled, so as to provide a larger contact surface via which the pipes bear on the winding. The mechanical processing of the pipes may be carried out after embedding in the support, in which case the latter will also be eroded correspondingly by the milling process.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
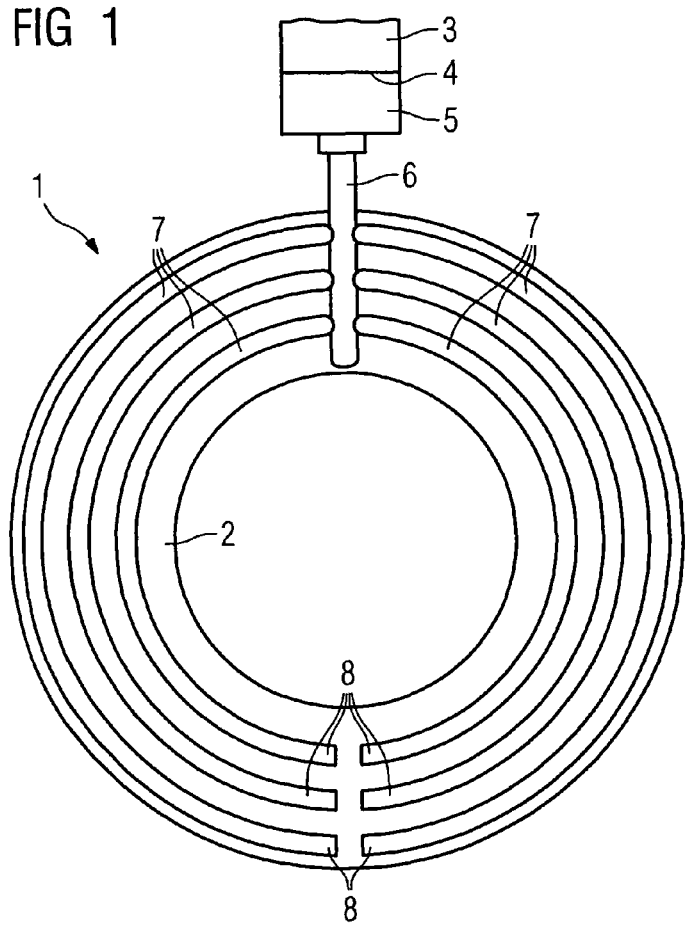
FIG. 1 is a side view of a device according to an aspect of the invention, representing the pipe layout with a disk coil.

Reference will now be made in detail to the preferred embodiments of the present invention, examples of which are illustrated in the accompanying drawings, wherein like reference numerals refer to like elements throughout.

FIG. 1, like all the other views, only shows details essential for the invention. A device 1 is shown, having a winding 2 of superconducting material which forms the magnet. The winding 2 is designed as a disk winding or disk coil and it may be formed, for example, by a strip 4 mm wide and 0.25 mm thick which has been wound to form the disk and which contains superconductor material, preferably high-$T_c$ superconductor materials such as $(Bi,Pb)_2Sr_2Ca_2Cu_3O_x$. The winding 2 can of course be connected as usual via contact means (not shown in detail) to a corresponding pulse or alternating-current supply, etc., in order to generate a pulsed magnetic field.

A refrigerating unit (not shown in detail), with at least one cold head 3 located at its cold end, is provided in order to cool the coil or winding 2. This cold head has, or is thermally connected to, a cold surface 4 to be kept at a predetermined temperature level. The interior of a condenser chamber 5 is thermally coupled to this cold surface 4; for example, the cold surface 4 forms a wall of this condenser space. A refrigerant distributor 6 in the form of a tube is connected to the condenser chamber 5. Pipes 7 which extend in an arc shape or semicircularly on both sides of the tube, all of which lie next to one another and in a common plane, are connected to this tube which is closed at the lower end. The pipes 7 are closed at their lower end 8. The entire line system operates according to the thermosiphon effect. The refrigerant recondensed in the condenser chamber 5 or on the cold surface 4, for example helium or neon or the like, flows downward in the refrigerant distributor 6 and via it into the pipes 7 which have a gradient over their entire length. The pipes 7 are in thermal contact with the winding 2, see FIG. 2. While flowing toward the lower end 8, the refrigerant absorbs heat and evaporates. The evaporating refrigerant flows back in the respective pipe 7 via the refrigerant distributor 6 and into the condenser chamber, where it is recondensed again. A closed circulating circuit is thus produced. A power supply 28 is provided for generating a pulsed magnetic field.

Figure 2:
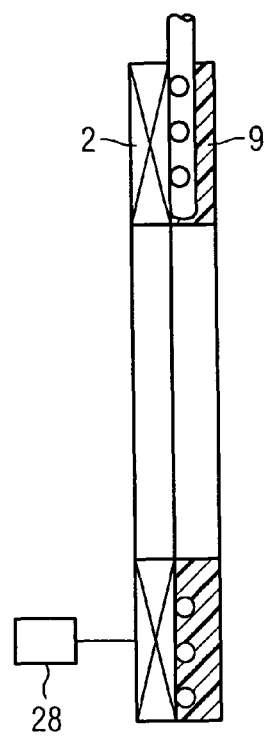
FIG. 2 is a vertical sectional view through the device according to FIG. 1.

The pipes 8 are embedded or encapsulated in a support 9, preferably made of glass fiber-reinforced plastic, see FIG. 2. For the sake of better clarity, this support is not represented in the view according to FIG. 1. The pipes 7 as well as the refrigerant supply line 6 preferably lie directly in contact with the winding 2, i.e. they are embedded in the support 9 so that they bear directly on the winding 2. To this end, it is possible to flatten the pipes 7 at their free end, see FIG. 3, so as to obtain a flat surface 10 such that a larger contact surface with the winding 2 is produced.

The pipes 7 as well as the refrigerant distributor 6 are preferably made of stainless steel, which is conducive to minimizing any eddy currents. Owing to the "open" design of the line system which is evidently not closed in the lower region of the free ends 8 (the pipes thus do not form a closed-circuit), eddy currents cannot be induced or can be induced only to a minimal extent because of the pulse operation of the winding 2. The use of stainless steel as a material is expedient since any eddy currents still induced will decay substantially faster compared to copper, which is advantageous particularly at high frequencies. This is attributable to the substantially higher electrical resistance of stainless steel compared to copper.

Figure 3:
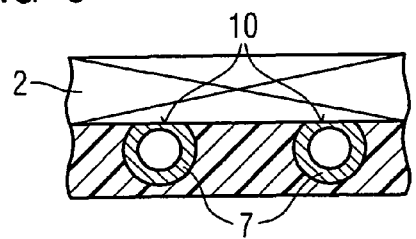
FIG. 3 is an enlarged detail sectional view of the connecting region between the pipes and the coil winding.

At this point, it should be pointed out that it is also possible to use elements which are rectangular as viewed cross-sectionally, instead of the cross-sectionally round pipes and refrigerant distributor represented in FIGS. 1-3, so long as the required geometries can be designed with a view to the arc layout.

Figure 4:
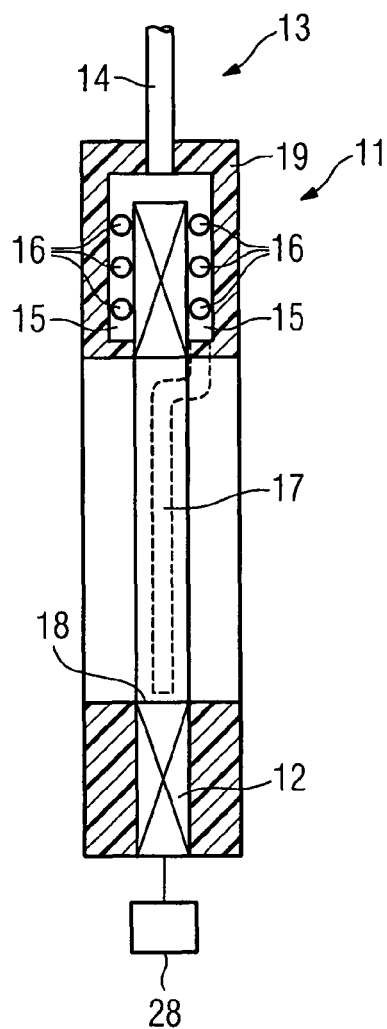
FIG. 4 is a vertical sectional view of an embodiment of the device having two pipes traveling in two planes, with a disk coil arranged between them.

FIG. 4 shows another embodiment of a device 11 according to an aspect of the invention, likewise having a disk winding 12. A refrigerating unit is also provided for cooling here, the cold head and the condenser chamber not being shown in detail. A refrigerant distributor 13 having of an upper line part 14, which is to be coupled to the cold head or the condenser chamber, is also represented here. It branches into two line sections 15, each line section 15 corresponding to the refrigerant distributor 6 i.e. the pipe in FIG. 1. A plurality of pipes 16, respectively three in the example shown, are connected to each line section 15 on both sides, as already known from FIG. 1. These pipes are not shown in detail as extending around in the sectional view according to FIG. 4, but the geometry or line layout corresponds to that as shown in FIG. 1, merely with the difference that the corresponding pipes, which naturally here again are not circularly closed but have closed free ends, are provided on both sides of the winding 12. In this configuration of the device 11, it is thus possible to cool the disk winding 12 over a large area from both sides via the side surfaces of the winding 12.

Optionally (not shown in FIG. 4) one or two pipes 17 may be guided, starting from the line section 15, into the interior of the annular winding 12 so that these two pipes 17 (only one of which is shown by dashes in FIG. 4) travel along the inner circumference 18 of the winding 12 and cool it. In this way, cooling is produced not only via the side surface but also via the narrow inner surface or inner circumference. Equally, as an alternative or in addition, it is naturally also conceivable for such a pipe to be guided along the outer circumference of the winding 12, in which case the support 19 that embeds all the pipes also correspondingly extends around the entire outer circumference. The winding 12 itself is sandwiched on both sides between the two pipe planes and is in direct thermal contact with the pipes 16 (and optionally 17), in which case the pipes may again be correspondingly flattened at the free contact surface.

Figure 5:
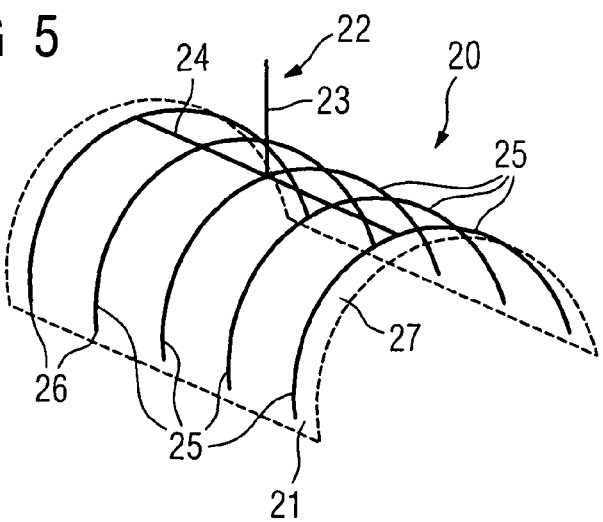
FIG. 5 is a perspective view of an outline representation of the device according to an aspect of the invention when a saddle coil is used.

FIG. 5 shows another device 20 according to an aspect of the invention in the form of an outline sketch. The winding 21 forming the magnet is designed as a saddle coil here. A line system is again provided, which can be connected via a refrigerant distributor 22 to a refrigerating machine (also not shown in detail here) or its cold head etc. To this end, the refrigerant distributor has a single first line section 23 which can be connected to the refrigerant condenser or the like and which merges into a second line section 24 extending essentially over the length of the saddle coil 21. A plurality of pipes 25 extend in a comb-like fashion on both sides of it, and these—as already described for the pipes in the exemplary embodiments described above—end with their lower ends 26 free and are closed there, so that a thermosiphon effect which allows the refrigerant to circulate is obtained in this case as well. Here again, the pipes 25 are naturally embedded in a suitable support (which is not shown in detail for the sake of clarity) and are in direct contact with the surface 27 of the saddle coil 21 in order to cool it. Once more, if cross-sectionally round pipes 25 are used, these may be correspondingly processed flatly on their contact surface, preferably milled, so as to obtain a large contact surface.

Although the pipes are arranged relatively far apart from one another in the exemplary embodiments, it is of course possible to produce an arbitrarily high packing density up to approximately direct contact between the individual pipes. In the end, this depends on what precise number of pipes required per unit area is to be provided with a view to the existing power loss density and the thermal conductivity of the turns, and thus as a function of the design or operation of the coil itself.

Particularly in the case of a disk winding, it is possible first to produce the support plus embedded pipes and subsequently wind the disk winding directly onto the support. As an alternative, it is possible to produce the winding and support plus pipes separately and bond them together.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

What is claimed is:

1. A device coupled to at least one cold head of a refrigeration unit and a power supply for generating a pulsed magnetic field, comprising:
    a magnet for pulse operation, including at least one winding of superconductive material and being refrigerant-free, the winding having a surface and one of a disk-shape and a saddle-shape; and
    a line system thermally coupling the winding to the cold head by a common refrigerant circulating within the line system according to a thermosiphon effect, said line system including
        a refrigerant distributor configured to distribute the common refrigerant to the entire line system, and
        a plurality of separate pipes, each pipe being thermally coupled to the surface of the winding, lying next to one another in a common plane, open at one end onto the refrigerant distributor and closed at an opposite end.

2. The device as claimed in claim 1,
    wherein the separate pipes include a first set of arc-shaped pipes connected to at least one side of the common refrigerant distributor.

3. The device as claimed in claim 2, wherein the separate pipes lie on concentric circular paths.

4. The device as claimed in claim 3, wherein the first set of arc-shaped pipes include pairs of pipes, the pipes in each pair having a common circular path of equal radius and equal length, extending on either side of the refrigerant distributor.

5. The device as claimed in claim 4,
    wherein the separate pipes include a second set of arc-shaped pipes in a second plane parallel to the first plane, and
    wherein the winding is disposed between and thermally coupled to the first and second set of arc-shaped pipes.

6. The device as claimed in claim 5,
    wherein the winding has an opening between the sides thereof forming a ring shape with an inside edge and an outside edge connecting the sides thereof, and
    wherein the separate pipes include at least one further pipe connected to the common refrigerant distributor, formed along at least one of the inside and outside edges of the winding.

7. The device as claimed in claim 3,
    wherein the separate pipes include a second set of arc-shaped pipes in a second plane parallel to the first plane, and
    wherein the winding is disposed between and thermally coupled to the first and second set of arc-shaped pipes.

8. The device as claimed in claim 7,
    wherein the winding has an opening between the sides thereof forming a ring shape with an inside edge and an outside edge connecting the sides thereof, and
    wherein the separate pipes include at least one further pipe connected to the common refrigerant distributor, formed along at least one of the inside and outside edges of the winding.

9. The device as claimed in claim 2,
    wherein the separate pipes include a second set of arc-shaped pipes in a second plane parallel to the first plane, and
    wherein the winding is disposed between and thermally coupled to the first and second set of arc-shaped pipes.

10. The device as claimed in claim 9,
    wherein the winding has an opening between the sides thereof forming a ring shape with an inside edge and an outside edge connecting the sides thereof, and
    wherein the separate pipes include at least one further pipe connected to the common refrigerant distributor, formed along at least one of the inside and outside edges of the winding.

11. The device as claimed in claim 2,
    wherein the winding has an opening between the sides of the winding forming a ring shape with an inside edge and an outside edge connecting the sides of the winding, and
    wherein the separate pipes include at least one further pipe connected to the common refrigerant distributor, formed along at least one of the inside and outside edges of the winding.

12. The device as claimed in claim 1,
    wherein the winding is saddle-shaped, and
    wherein the separate pipes are arc-shaped and are connected in a comb-like fashion to at least one side of the common refrigerant distributor.

13. The device as claimed in claim 2, wherein the separate pipes extend on either side of the common refrigerant distributor and are equally long.

14. The device as claimed in claim 13, wherein the pipes are made of stainless steel.

15. The device as claimed in claim 14, wherein the common refrigerant distributor is made of stainless steel.

16. The device as claimed in claim 13, further comprising a support made of electrically insulating material in which the separate pipes are embedded.

17. The device as claimed in claim 16, wherein the common refrigerant distributor is embedded in the support made of electrically insulating material.

18. The device as claimed in claim 17, wherein said support is made of glass fiber-reinforced plastic.

19. The device as claimed in claim 18, wherein the pipes have a rectangular cross-section.

20. The device as claimed in claim 18, wherein the pipes have a round cross-section with a flattened side facing the winding.

21. The device as claimed in claim 2, wherein the pipes are made of stainless steel.

22. The device as claimed in claim 21, wherein the common refrigerant distributor is made of stainless steel.

23. The device as claimed in claim 2, further comprising a support made of electrically insulating material in which the separate pipes are embedded.

24. The device as claimed in claim 23, wherein the common refrigerant distributor is embedded in the support made of electrically insulating material.

25. The device as claimed in claim 24, wherein said support is made of glass fiber-reinforced plastic.

26. The device as claimed in claim 25, wherein the pipes have a rectangular cross-section with a side facing the winding.

27. The device as claimed in claim 25, wherein the pipes have a substantially round cross-section with a flattened side facing the winding.

28. A device coupled to at least one cold head of a refrigeration unit and a power supply for generating a pulsed magnetic field, comprising:

a magnet for pulse operation, including at least one winding of superconductive material and being refrigerant-free, the winding having a surface and one of a disk-shape and a saddle-shape; and a line system thermally coupling the winding to the cold head by a refrigerant circulating within the line system according to a thermosiphon effect, said line system including a refrigerant distributor configured as a tube and connected to a condenser chamber that is thermally coupled to the cold head and configured to condense the refrigerant, and a plurality of separate pipes, thermally coupled to the surface of the winding, lying next to one another in a common plane, open at one end onto the common refrigerant distributor and closed at an opposite end.

* * * * *